(12) United States Patent
Han et al.

(10) Patent No.: US 12,477,896 B2
(45) Date of Patent: Nov. 18, 2025

(54) DISPLAY DEVICE INCLUDING DUAL SLOTTED CURVED-SERVICE REGION

(71) Applicant: BOE Technology Group Co., Ltd., Beijing (CN)

(72) Inventors: Ziang Han, Beijing (CN); Haoran Wang, Beijing (CN); Chunyan Xie, Beijing (CN); Song Zhang, Beijing (CN); Jing Wang, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 552 days.

(21) Appl. No.: 17/913,669

(22) PCT Filed: Nov. 4, 2021

(86) PCT No.: PCT/CN2021/128659
§ 371 (c)(1),
(2) Date: Sep. 22, 2022

(87) PCT Pub. No.: WO2022/188441
PCT Pub. Date: Sep. 15, 2022

(65) Prior Publication Data
US 2023/0115315 A1 Apr. 13, 2023

(30) Foreign Application Priority Data
Mar. 9, 2021 (CN) .......................... 202110255458.1

(51) Int. Cl.
*H10K 50/84* (2023.01)
*H10K 50/844* (2023.01)
(Continued)

(52) U.S. Cl.
CPC .......... *H10K 50/844* (2023.02); *H10K 77/111* (2023.02); *H10K 2102/311* (2023.02)

(58) Field of Classification Search
CPC .. H10K 50/844; H10K 59/871; H10K 59/873; H10K 59/40; H10K 77/111; G09F 9/301; G09F 9/33
See application file for complete search history.

(56) References Cited

U.S. PATENT DOCUMENTS 11,081,660 B2 * 8/2021 Lee ..................... H10K 59/8731
2017/0045914 A1 * 2/2017 Namkung .............. H05K 1/028
(Continued)

FOREIGN PATENT DOCUMENTS

CN 110277022 A 9/2019
CN 209418505 U 9/2019
(Continued)

OTHER PUBLICATIONS

Office Action dated Jun. 2, 2022, issued in counterpart CN Application No. 202110255458.1, with English Translation. (15 pages).

*Primary Examiner* — Ida M Soward
(74) *Attorney, Agent, or Firm* — WHDA, LLP

(57) ABSTRACT

A display device, which relates to the technical field of displaying. In the present application, a protecting layer is provided on one side away from the light-emitting surface of the display panel, a supporting layer is provided on the side of the protecting layer that is away from the display panel, the protecting layer is provided with at least one first slot, the supporting layer is provided with a perforative second slot, an overlap region exists between an orthographic projection of the first slot on the display panel and an orthographic projection of the second slot on the display panel, the orthographic projection of the second slot on the display panel is located in the curved-surface region, and a first bonding layer is provided inside the first slot and the second slot.

12 Claims, 6 Drawing Sheets

(51) Int. Cl.
*H10K 77/10* (2023.01)
*H10K 102/00* (2023.01)

(56) References Cited

U.S. PATENT DOCUMENTS

| | | | |
|---|---|---|---|
| 2017/0054106 A1* | 2/2017 | Jeon | H10K 59/873 |
| 2017/0358772 A1* | 12/2017 | Sung | H10K 59/124 |
| 2020/0093016 A1* | 3/2020 | Yee | G06F 1/1637 |
| 2020/0380893 A1* | 12/2020 | Park | G06F 1/1652 |
| 2021/0367173 A1 | 11/2021 | Lee et al. | |
| 2022/0037621 A1 | 2/2022 | Xue et al. | |
| 2022/0324196 A1 | 10/2022 | Zhu | |

FOREIGN PATENT DOCUMENTS

| | | | | |
|---|---|---|---|---|
| CN | 110416266 A | | 11/2019 | |
| CN | 110444678 A | | 11/2019 | |
| CN | 111312794 A | | 6/2020 | |
| CN | 211455154 U | | 9/2020 | |
| CN | 111833750 A | * | 10/2020 | G03B 29/00 |
| CN | 112150923 A | | 12/2020 | |
| CN | 112419890 A | * | 2/2021 | G09F 9/301 |
| CN | 112436041 A | | 3/2021 | |
| CN | 113054132 A | | 6/2021 | |
| KR | 20170111827 A | * | 10/2017 | H04M 1/0269 |
| WO | WO-2015029704 A1 | * | 3/2015 | G06F 1/1643 |

* cited by examiner

DISPLAY DEVICE INCLUDING DUAL SLOTTED CURVED-SERVICE REGION

The present application claims the priority of the Chinese patent application filed on Mar. 9, 2021 before the CNIPA, China National Intellectual Property Administration with the application number of 202110255458.1 and the title of "DISPLAY DEVICE", which is incorporated herein in its entirety by reference.

TECHNICAL FIELD

The present application relates to the technical field of displaying, and more particularly, to a display device.

BACKGROUND

With the development of the technique of displaying, people have increasingly higher requirements on display devices. In order to satisfy the demands on aesthetics, full screens, and so on, it is required to design the edge of display devices into a curved-surface structure.

SUMMARY

Some embodiments of the present application provide the following technical solutions:

In the first aspect, there is provided a display device, wherein the display device includes:
- a display panel;
- a protecting layer provided on one side away from a light-emitting surface of the display panel; and
- a supporting layer provided on one side of the protecting layer that is away from the display panel;
- the display panel includes a flat-surface region and a curved-surface region that is located on at least one side of the flat-surface region, and an orthographic projection of the supporting layer on the display panel is located in at least the curved-surface region;
- in a direction perpendicular to the light-emitting surface of the display panel, the protecting layer is provided with at least one first slot, the supporting layer is provided with an perforative second slot, an overlap region exists between an orthographic projection of the first slot on the display panel and an orthographic projection of the second slot on the display panel, and the orthographic projection of the second slot on the display panel is located in the curved-surface region; and
- the display device further includes a first bonding layer that is provided inside the first slot and the second slot.

Optionally, wherein the supporting layer is provided with second slots corresponding to the first slots one by one, and each of the first slots communicates with the corresponding second slot.

Optionally, the protecting layer is provided with at least two first slots, the supporting layer is provided with one or more second slots, and an orthographic projection of each of the second slots on the display panel covers orthographic projections of at least two first slots on the display panel.

Optionally, in the direction perpendicular to the light-emitting surface of the display panel, each of the second slots includes at least two sub-slots that are sequentially communicated, and for any two adjacent instances of the sub-slots, an orthographic projection on the display panel of a sub-slot close to the display panel is located in an orthographic projection on the display panel of a sub-slot away from the display panel.

Optionally, an orthographic projection on the display panel of a sub-slot closest to the display panel covers an orthographic projection of the first slot on the display panel.

Optionally, an orthographic projection on the display panel of a sub-slot closest to the display panel is located in an orthographic projection of the first slot on the display panel, and all of orthographic projections on the display panel of the sub-slots of the second slot other than the sub-slot closest to the display panel cover the orthographic projection of the first slot on the display panel.

Optionally, the orthographic projection of the supporting layer on the display panel is further located in the flat-surface region.

Optionally, the display panel includes an active area, and the active area includes at least the flat-surface region.

Optionally, the active area completely overlaps with the flat-surface region; or
- the active area includes the flat-surface region and part of the curved-surface region; or
- the active area includes the flat-surface region and the whole of the curved-surface region.

Optionally, the flat-surface region includes two opposite first side edges and two opposite second side edges, and included angles between the first side edges and the second side edges are not 0; and
- the curved-surface region is located on one side where any one of the first side edges or any one of the second side edges is located; or
- the curved-surface region is located on sides where the two first side edges or the two second side edges are located; or
- the curved-surface region is located on sides where the two first side edges and the two second side edges are located.

Optionally, a depth of the first slot is less than or equal to a thickness of the protecting layer, and the thickness of the protecting layer is 25 μm to 200 μm.

Optionally, the protecting layer is provided with a plurality of the first slots, and a plurality of the first slots are distributed in a row direction and/or a column direction.

Optionally, a shape of the orthographic projection of the first slot on the display panel is a rectangle, a length of the first slot in the row direction is 5 mm to 30 mm, and a width of the first slot in the column direction is 1 mm to 3 mm; or
- a shape of the orthographic projection of the first slot on the display panel is a circle, and a diameter of the first slot is 1 mm to 3 mm.

Optionally, the display device further includes: a second bonding layer, a polarizer, a third bonding layer and a cover plate that are sequentially arranged on the light-emitting surface of the display panel in stack, and the second bonding layer, the polarizer, the third bonding layer and the cover plate are sequentially away from the display panel.

Optionally, the display panel includes the active area, a bonding region and a bending region located between the active area and the bonding region;
- the display device further includes a bonding component provided in the bonding region, and a flexible circuit board bonded to the bonding component; and
- the bonding component and the flexible circuit board are located on an opposite side of a light emitting side of the display panel, and the display panel located in the bonding region is bonded to the supporting layer.

In the second aspect, there is provided a method for fabricating a display device, wherein the method includes:

providing a display panel, wherein the display panel includes a flat-surface region and a curved-surface region that is located on at least one side of the flat-surface region;

forming a protecting layer on one side away from the light-emitting surface of the display panel, wherein in a direction perpendicular to the light-emitting surface of the display panel, the protecting layer is provided with at least one first slot;

forming a supporting layer on one side of the protecting layer that is away from the display panel, wherein an orthographic projection of the supporting layer on the display panel is located in at least the curved-surface region, and in the direction perpendicular to the light-emitting surface of the display panel, the supporting layer is provided with a perforative second slot; and forming a first bonding layer inside the first slot and the second slot;

wherein an overlap region exists between an orthographic projection of the first slot on the display panel and an orthographic projection of the second slot on the display panel, and the orthographic projection of the second slot on the display panel is located in the curved-surface region.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly introduced below. Apparently, the figures that are described below are embodiments of the present application, and a person skilled in the art can obtain other figures according to these figures without paying creative work.

DETAILED DESCRIPTION OF THE EMBODIMENTS

In order to make the above purposes, features and advantages of the present application more apparent and understandable, the present application will be described in further detail below with reference to the drawings and the particular embodiments.

Figure 1:
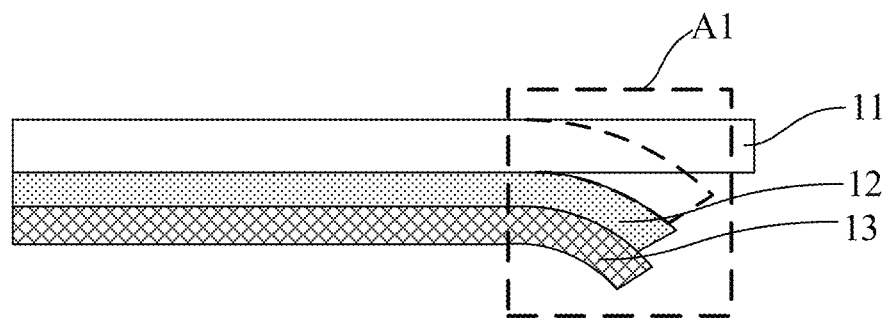
FIG. 1 shows a schematic sectional view of a display device in the related art.

In the related art, as shown in FIG. 1, regarding a display device with a curved-surface structure for the edges, it includes a display panel 11 provided with a protecting layer, a first bonding layer 12 and a supporting layer 13, and the display panel 11 provided with a protecting layer includes a display panel, a protecting layer and a second bonding layer provided between the display panel and the protecting layer. In the practical manufacturing process, the edge of the supporting layer 13 is required to be made into a curved-surface structure with an arc shape, and then the display panel 11 provided with the protecting layer is adhered to the supporting layer 13 through the first bonding layer 12, so that the display panel 11 provided with the protecting layer is also bent in the curved-surface region of the supporting layer 13, whereby the edge of the display device is of curved-surface structure.

However, due to the thickness of the display panel 11 provided with the protecting layer is large, the recovery force at the curved-surface region A1 is strong, therefore, the display panel 11 provided with the protecting layer is easy to return from the curved state to the flat state. Therefore, the first bonding layer 12 may not firmly bond the display panel 11 provided with the protecting layer and the supporting layer 13, which results in that the display panel 11 provided with the protecting layer and the supporting layer 13 separate in the curved-surface region A1.

In order to ensure that the display panel 11 provided with the protecting layer and the supporting layer 13 may be stably bonded together, the material composition of the first bonding layer 12 may be improved, to optimize the bonding performance of the first bonding layer 12, and temporarily alleviate the problem of separation between the display panel 11 provided with the protecting layer and the supporting layer 13 at normal temperature, to ensure the normal proceeding of the subsequent process steps. However, the display panel 11 with the protecting layer may still be separated from the supporting layer 13 during reliability testing at high temperature and humidity.

Therefore, in the embodiments of the present application, by providing a perforative second slot in the supporting layer located in the curved-surface region, and providing a first slot in the protecting layer at the corresponding region, wherein the first slot communicates with the second slot, when the first bonding layer is provided inside the first slot and the second slot, the bonding forces of the first bonding layer with the protecting layer and the supporting layer are increased, so that the display panel formed with the protecting layer may be stably and firmly bonded to the supporting layer having the curved-surface structure, which prevents separation between the protecting layer and the supporting layer, thereby ensuring the normal proceeding of the subsequent process step of the entire device assembling of the display device, and improving the reliability of the product.

Figure 2:
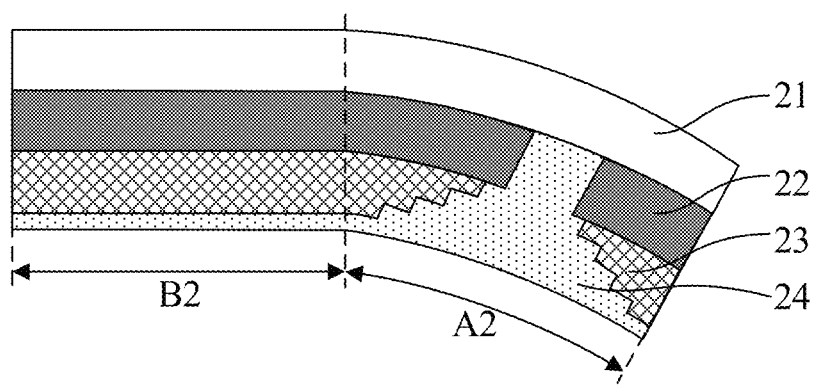
FIG. 2 shows a schematic sectional view of a display device according to an embodiment of the present application.
Figure 3:
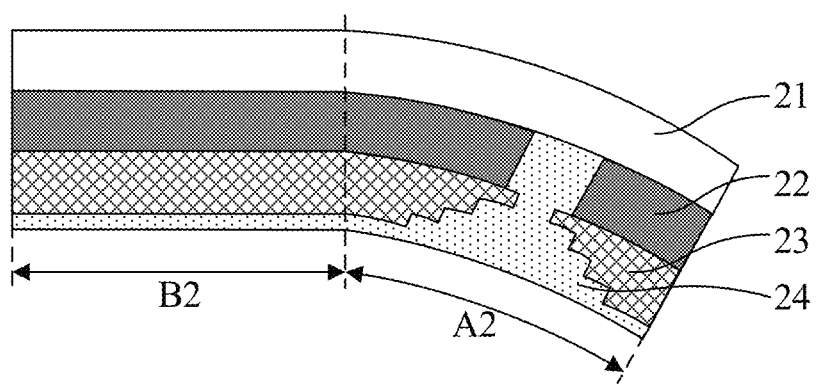
FIG. 3 shows a schematic sectional view of another display device according to an embodiment of the present application.
Figure 4:
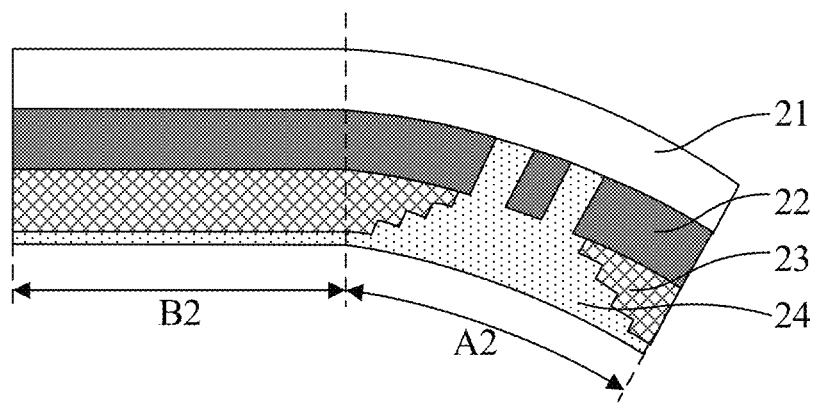
FIG. 4 shows a schematic sectional view of yet another display device according to an embodiment of the present application.

Referring to FIG. 2, which shows a schematic sectional view of a display device according to an embodiment of the present application. FIG. 3 shows a schematic sectional view of another display device according to an embodiment of the present application. FIG. 4 shows a schematic sectional view of yet another display device according to an embodiment of the present application.

An embodiment of the present application provides a display device, wherein the display device includes: a display panel 21, a protecting layer 22 provided on the side away from the light-emitting surface of the display panel 21, and a supporting layer 23 provided on the side of the protecting layer 22 that is away from the display panel 21. The display panel 21 includes a flat-surface region B2 and a curved-surface region A2 that is located on at least one side of the flat-surface region B2, and the orthographic projection of the supporting layer 23 on the display panel 21 is located at least in the curved-surface region A2. In the direction perpendicular to the light-emitting surface of the display panel 21, the protecting layer 22 is provided with at least one first slot, the supporting layer 23 is provided with a perforative second slot, an overlap region exists between the orthographic projection of the first slot on the display panel 21 and the orthographic projection of the second slot on the display panel 21, and the orthographic projection of the second slot on the display panel 21 is located in the curved-surface region A2. The display device further includes a first bonding layer 24 that is provided inside the first slot and the second slot.

In the practical product, the display panel 21 is an Organic Light Emitting Diode (OLED) display panel, and includes a flexible substrate, a pixel driving circuit provided on the flexible substrate, a light-emitting-device layer provided on the side of the pixel driving circuit that is away from the flexible substrate, and a packaging layer covering the light-emitting-device layer. Moreover, the display panel 21 may further include a touch-controlling-function layer provided on the side of the packaging layer that is away from the light-emitting-device layer. The light-emitting-device layer includes an anode, a cathode and an organic luminescent layer provided between the anode and the cathode. The pixel driving circuit is connected to the anode of the light-emitting-device layer, and is used to provide a voltage to the anode, to drive the organic luminescent layer to emit light. The packaging layer is a thin-film packaging layer, and includes an organic packaging layer and/or an inorganic packaging layer, to prevent water and oxygen from entering the display panel 21. The touch-controlling-function layer includes a touch-controlling driving electrode and a touch-controlling sensing electrode, to detect the position of the touch controlling by the user. Furthermore, the display panel 21 includes a flat-surface region B2 and a curved-surface region A2 that is located on at least one side of the flat-surface region B2.

A protecting layer 22 is provided on the side of the display panel 21 that is away from the light-emitting surface, and the orthographic projection of the protecting layer 22 on the display panel 21 is located in the flat-surface region B2 and the curved-surface region A2 of the display panel 21. The protecting layer 22 is actually the back film of the display device. In the direction perpendicular to the light-emitting surface of the display panel 21, the protecting layer 22 is provided with at least one first slot, and each of the first slots may penetrate the protecting layer 22, and may not penetrate the protecting layer 22.

A supporting layer 23 is provided on the side of the protecting layer 22 that is away from the display panel 21, and the orthographic projection of the supporting layer 23 on the display panel 21 is located at least in the curved-surface region A2 of the display panel 21. Furthermore, in the direction perpendicular to the light-emitting surface of the display panel 21, the supporting layer 23 is provided with a perforative second slot, and the orthographic projection of the second slot on the display panel 21 is located in the curved-surface region A2. The quantity of the second slot may be one or more, and an overlap region exists between the orthographic projection of the first slot on the display panel 21 and the orthographic projection of the second slot on the display panel 21; in other words, the first slot communicates with the second slot.

Moreover, a first bonding layer 24 is provided inside the first slot and the second slot. The material of the first bonding layer 24 is a solidification-type adhesive, for example, an ultraviolet solidification-type adhesive or a thermal solidification-type adhesive. It is used to bond the supporting layer 23 and the protecting layer 22 in the curved-surface region A2 together.

It should be noted that, after the supporting layer 23 is obtained, the supporting layer 23 is provided with a flat-surface structure and a curved-surface structure, wherein the curved-surface structure is located in the edge region of the supporting layer 23. Before the protecting layer 22 fixed to the backlight side of the display panel 21 is bonded to the supporting layer 23, all of the regions of the protecting layer 22 and the display panel 21 are of a flat-surface structure. Moreover, after the protecting layer 22 fixed to the backlight side of the display panel 21 is bonded to the supporting layer 23 through the first bonding layer 24, the position of the protecting layer 22 that contacts the curved-surface structure of the supporting layer 23 is also of a curved-surface structure, and the corresponding position of the display panel 21 is also of a curved-surface structure correspondingly, whereby the display panel 21 is provided with the flat-surface region B2 and the curved-surface region A2 that is located on at least one side of the flat-surface region B2. In addition, because the light-emitting surface of the display panel 21 is of a curved-surface structure in the curved-surface region A2, the extension direction of the first slot and the second slot is perpendicular to the light-emitting surface of the display panel 21 of the curved-surface structure.

In the practical product, in the curved-surface region A2, all of the surface of the supporting layer 23 on the side opposite to the protecting layer 22, the surface of the supporting layer 23 that contacts the protecting layer 22, the surface of the protecting layer 22 that contacts the display panel 21 and the light-emitting surface of the display panel 21 are of a curved-surface structure. Particularly, the curved-surface structure is an arc surface.

In the embodiments of the present application, by providing the perforative second slot in the supporting layer 23 located in the curved-surface region A2, and providing the first slot in the protecting layer 22 at the corresponding region, wherein the first slot communicates with the second slot, when the first bonding layer 24 is provided inside the first slot and the second slot, the bonding forces of the first bonding layer 24 with the protecting layer 22 and the supporting layer 23 are increased, so that the display panel 21 formed with the protecting layer 22 may be stably and firmly adhered to the supporting layer 23 having the curved-surface structure, which prevents separation between the protecting layer 22 and the supporting layer 23, thereby ensuring the normal proceeding of the subsequent process steps, and improving the reliability of the product.

In an alternative embodiment of the present application, as shown in FIG. 2 and FIG. 3, the supporting layer 23 is provided with second slots that correspond to the first slots one by one, and each of the first slots communicates with the corresponding second slot.

In this case, the quantity of the first slots and the quantity of the second slots are equal, and each of the first slots merely communicates with the second slot corresponding to it; in other words, the first slots and the second slots correspond one by one.

In another alternative embodiment of the present application, as shown in FIG. 4, the protecting layer 22 is provided with at least two first slots, the supporting layer 23 is provided with one or more second slots, and the orthographic projection of each of the second slots on the display panel 21 covers the orthographic projections of at least two first slots on the display panel 21.

In this case, the quantity of the first slots is less than the quantity of the second slots, the quantity of the second slots provided in the supporting layer 23 is at least one, and the orthographic projection of each of the second slots on the display panel 21 covers the orthographic projections of at least two first slots on the display panel 21; in other words, each of the second slots communicates with at least two first slots.

For example, the protecting layer 22 is provided with 4 first slots, the supporting layer 23 is provided with 2 second slots, and the orthographic projection of each of the second slots on the display panel 21 covers the orthographic projections of 2 first slots on the display panel 21. Alternatively, the protecting layer 22 is provided with 4 first slots, the supporting layer 23 is provided with 1 second slot, and the orthographic projection of the second slot on the display panel 21 covers the orthographic projections of all of the first slots on the display panel 21.

In an embodiment of the present application, as shown in FIG. 2 to FIG. 4, in the direction perpendicular to the light-emitting surface of the display panel 21, each of the second slots includes at least two sub-slots that are sequentially communicated, and for any two adjacent sub-slots, the orthographic projection on the display panel 21 of the sub-slot close to the display panel 21 is located in the orthographic projection on the display panel 21 of the sub-slot away from the display panel 21.

By configuring the second slot to be at least two sub-slots that are sequentially communicated, the side wall of the second slot is of a step shape, and the orthographic projection on the display panel 21 of the sub-slot close to the display panel 21 is located in the orthographic projection on the display panel 21 of the sub-slot away from the display panel 21. In other words, the sizes of the sub-slots increase gradually from the direction close to the display panel 21 to the direction away from the display panel 21.

All of the shapes of the orthographic projections of the sub-slots on the display panel 21 are closed patterns, for example, a rectangle or a circle. When the shapes of the orthographic projections of the sub-slots on the display panel 21 are rectangles, from the direction close to the display panel 21 to the direction away from the display panel 21, the lengths of the sub-slots gradually increase, while the widths of the sub-slots remain unchanged. Alternatively, the lengths of the sub-slots remain unchanged, while the widths of the sub-slots gradually increase. Alternatively, both of the lengths and the widths of the sub-slots gradually increase. When the shapes of the orthographic projections of the sub-slots on the display panel 21 are circles, from the direction close to the display panel 21 to the direction away from the display panel 21, the diameters of the sub-slots gradually increase. The length of a sub-slot refers to the dimension of the sub-slot in the direction parallel to the row direction of the display panel 21, and the width of a sub-slot refers to the dimension of the sub-slot in the direction parallel to the column direction of the display panel 21.

It should be noted that the second slot may also include merely one sub-slot, in which case the shape of the orthographic projection of the second slot on the display panel 21 is a closed pattern. When the second slot is configured to be at least two sub-slots that are sequentially communicated, the first bonding layer 24 provided inside the first slots and the second slots is provided with a larger contact area with the supporting layer 23, and therefore the bonding force between the protecting layer 22 and the supporting layer 23 is larger, thereby further preventing separation between the protecting layer 22 and the supporting layer 23.

As shown in FIG. 2 and FIG. 4, the orthographic projection on the display panel 21 of the sub-slot closest to the display panel 21 covers the orthographic projection of the first slot on the display panel 21.

In other words, the size of the sub-slot closest to the display panel 21 is greater than the size of the first slot. Furthermore, because the sizes of the sub-slots gradually increase from the direction close to the display panel 21 to the direction away from the display panel 21, all of the sizes of the sub-slots of the second slot are greater than the sizes of the first slots.

As shown in FIG. 3, the orthographic projection on the display panel 21 of the sub-slot closest to the display panel 21 is located in the orthographic projection of the first slot on the display panel 21, and all of the orthographic projections on the display panel 21 of the other sub-slots of the second slot than the sub-slot closest to the display panel 21 cover the orthographic projection of the first slot on the display panel 21.

In other words, the size of the sub-slot closest to the display panel 21 is less than the size of the first slot, and all of the sizes of the other sub-slots of the second slot than the sub-slot closest to the display panel 21 are greater than the size of the first slot.

It should be noted that, when the shape of the orthographic projection of a slot on the display panel 21 is a rectangle, the size of the slot refers to the length and/or the width of the slot, and when the shape of the orthographic projection of a slot on the display panel 21 is a circle, the size of the slot refers to the diameter of the slot.

In an embodiment of the present application, the depth of the first slot is less than or equal to the thickness of the protecting layer 22, and the thickness of the protecting layer 22 is 25 μm to 200 μm.

In the direction perpendicular to the light-emitting surface of the display panel 21, when the depth of the first slot is equal to the thickness of the protecting layer 22, the first slot penetrates the protecting layer 22, and in this case, the first bonding layer 24 contacts all of the supporting layer 23, the protecting layer 22 and the display panel 21. In the direction perpendicular to the light-emitting surface of the display panel 21, when the depth of the first slot is less than the thickness of the protecting layer 22, the first slot does not penetrate the protecting layer 22, and the opening of the first slot faces the side where the supporting layer 23 is located, in which case the first bonding layer 24 contacts merely the supporting layer 23 and the protecting layer 22. Because the protecting layer 22 and the supporting layer 23 are easily separated at the curved-surface region A2, while the protecting layer 22 and the display panel 21 are firmly fixed therebetween, by configuring the first slot as not penetrating the protecting layer 22, separation between the protecting layer 22 and the supporting layer 23 may also be prevented.

The thickness of the protecting layer 22 is 25 μm to 200 μm. For example, the thickness of the protecting layer 22 is 100 μm, and in this case the depth of the first slot may be 50 μm, 80 μm, 100 μm and so on. Alternatively, the thickness of the protecting layer 22 is 150 μm, and in this case the depth of the first slot may be 100 μm, 120 μm, 150 μm and so on.

As shown in FIG. 5 to FIG. 8, the protecting layer 22 is provided with a plurality of first slots 221, and a plurality of the first slots 221 are distributed in a row direction and/or a column direction.

Figure 5:
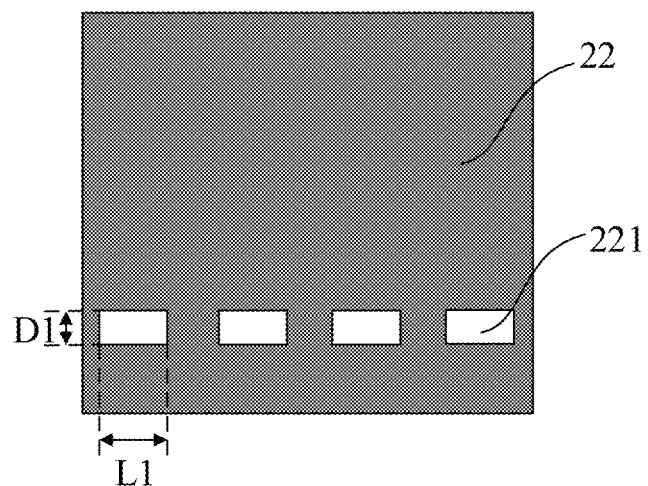
FIG. 5 shows a schematic plan view of the first type of the protecting layer according to an embodiment of the present application.
Figure 6:
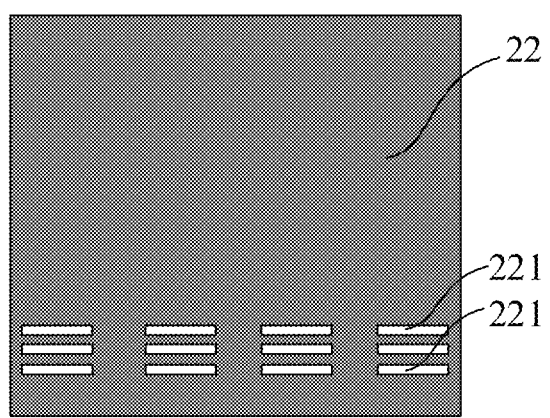
FIG. 6 shows a schematic plan view of the second type of the protecting layer according to an embodiment of the present application.
Figure 7:
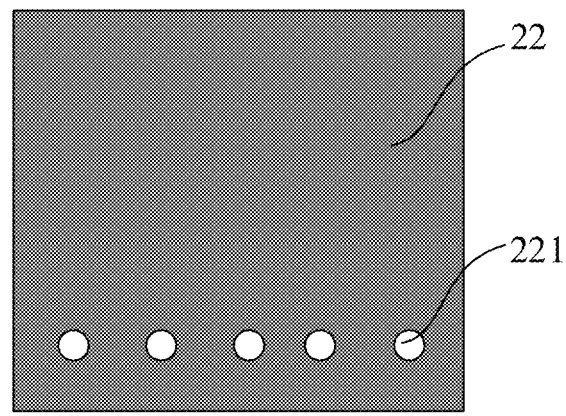
FIG. 7 shows a schematic plan view of the third type of the protecting layer according to an embodiment of the present application.
Figure 8:
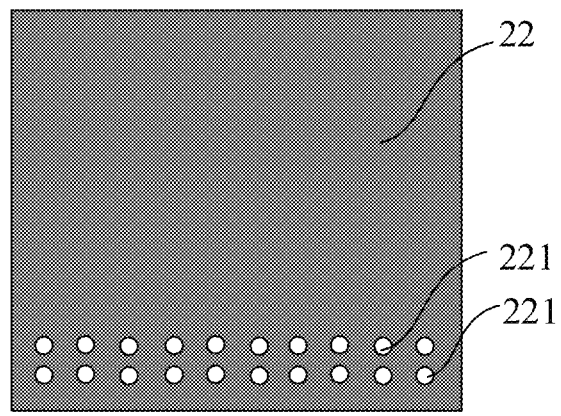
FIG. 8 shows a schematic plan view of the fourth type of the protecting layer according to an embodiment of the present application.

As shown in FIG. 5, the protecting layer 22 is provided with 4 first slots 221, and the 4 first slots 221 are distributed in the direction parallel to the row direction of the display panel 21. As shown in FIG. 6, the protecting layer 22 is provided with 12 first slots 221, and the 12 first slots 221 are distributed in 3 rows and 4 columns; in other words, in each of the rows are distributed 4 first slots 221, and in each of the columns are distributed 3 first slots 221. As shown in FIG. 7, the protecting layer 22 is provided with 5 first slots 221, and the 5 first slots 221 are distributed in the direction parallel to the row direction of the display panel 21. As shown in FIG. 8, the protecting layer 22 is provided with 20 first slots 221, and the 20 first slots 221 are distributed in 2 rows and 10 columns; in other words, in each of the rows are distributed 10 first slots 221, and in each of the columns are distributed 2 first slots 221.

As shown in FIG. 5 and FIG. 6, the shape of the orthographic projection of the first slot 221 on the display panel 221 is a rectangle, the length L1 of the first slot 221 in the row direction is 5 mm to 30 mm, and the width D1 of the first slot 221 in the column direction is 1 mm to 3 mm. In this case, the first slots 221 in the protecting layer 22 are rectangular holes. The length L1 of the first slots 221 is 5 mm to 30 mm; for example, the length L1 of the first slots 221 is 10 mm, 20 mm and so on. The width D1 of the first slots 221 is 1 mm to 3 mm; for example, the width D1 of the first slots 221 is 1.5 mm, 2 mm, 2.5 mm and so on.

As shown in FIG. 7 and FIG. 8, the shape of the orthographic projection of the first slot 221 on the display panel 221 is a circle, and the diameter of the first slot 221 is 1 mm to 3 mm. In this case, the first slots 221 in the protecting layer 22 are circular holes. The diameter of the first slots 221 is 1 mm to 3 mm; for example, the diameter of the first slots 221 is 1.5 mm, 2 mm, 2.5 mm and so on.

Moreover, the material of the protecting layer 22 may be any one or more of polyimide (PI), polyethylene terephthalate (PET), polyethylene (PE) and thermoplastic polyurethanes (TPU). The elasticity modulus of the protecting layer 22 is 2 Gpa to 7 Gpa. The material of the supporting layer 23 is a metal or a metal alloy such as stainless steel (SUS), a copper alloy, an aluminum alloy and a titanium alloy. In the direction perpendicular to the light-emitting surface of the display panel 21, the thickness of the supporting layer 23 is 30 μm to 200 μm.

It should be noted that the shape of the orthographic projection of the first slot 221 on the display panel 21 and the shape of the orthographic projection of the second slot on the display panel 21 may be the same, and may also be different. The first bonding layer 24 may be located merely inside the first slot 221 and the second slot. Certainly, besides the first bonding layer 24 provided inside the first slot 221 and the second slot, the first bonding layer 24 may also be located on the side of the supporting layer 23 that is away from the protecting layer 22.

Merely the structures and the relations of the display panel 21, the protecting layer 22, the supporting layer 23 and the first bonding layer 24 that are located in the curved-surface region A2 are described above, and the structures of the film layers in the flat-surface region B2 will be described below.

Particularly, the orthographic projection of the supporting layer 23 on the display panel 21 is further located in the flat-surface region B2. In other words, the orthographic projection of the supporting layer 23 on the display panel 21 is located in both of the curved-surface region A2 and the flat-surface region B2.

Moreover, in the flat-surface region B2, a fourth bonding layer (not shown in FIG. 2 to FIG. 4) is provided between the display panel 21 and the protecting layer 22, a fifth bonding layer (not shown in FIG. 2 to FIG. 4) is provided between the protecting layer 22 and the supporting layer 23, the display panel 21 located in the flat-surface region B2 is bonded to the protecting layer 22 located in the flat-surface region B2 through the fourth bonding layer, and the protecting layer 22 located in the flat-surface region B2 is bonded to the supporting layer 23 located in the flat-surface region B2 through the fifth bonding layer.

In an embodiment of the present application, the display panel 21 includes an active area, and the active area includes at least the flat-surface region B2. In the first alternative embodiment, the active area and the flat-surface region B2 totally overlap. In the second alternative embodiment, the active area includes the flat-surface region B2 and part of the curved-surface region A2. In the third alternative embodiment, the active area includes the flat-surface region B2 and the entire curved-surface region A2.

In the practical product, the active area refers to the region for displaying the frames of the display panel 21. The display panel 21 may display merely in the flat-surface region B2, and do not display in the curved-surface region A2, in which case the active area completely overlaps with the flat-surface region B2; in other words, the active area includes merely the flat-surface region B2. Alternatively, the display panel 21 may also display in the flat-surface region B2 and part of the curved-surface region A2, and do not display in the other part of the curved-surface region A2, in which case the active area includes the flat-surface region B2 and part of the curved-surface region A2. Alternatively, the display panel 21 may also display in the flat-surface region B2 and the entire curved-surface region A2, in which case the active area includes the flat-surface region B2 and the entire curved-surface region A2.

It should be noted that the position relation of the active area with the flat-surface region B2 and the curved-surface region A2 is determined according to practical products, and is not limited in the embodiments of the present application.

In an embodiment of the present application, the flat-surface region B2 includes two opposite first side edges and two opposite second side edges, and the included angles between the first side edges and the second side edges are not 0. The curved-surface region A2 is located on one side where any one of the first side edges or any one of the second side edges is located. Alternatively, the curved-surface region A2 is located on the sides where the two first side edges or the two second side edges are located. Alternatively, the curved-surface region A2 is located on the sides where the two first side edges and the two second side edges are located.

Particularly, the shape of the flat-surface region B2 is a quadrangle, it includes two opposite first side edges and two opposite second side edges, the two first side edges are parallel to each other, the two second side edges are parallel to each other, and the included angles between the first side edges and the second side edges are not 0. For example, the included angles between the first side edges and the second side edges are 90°; in other words, in this case, the shape of the flat-surface region B2 is a rectangle.

In different display devices, the positions of the curved-surface region A2 are different, and the curved-surface region A2 may be located on one side or more sides of the flat-surface region B2. The position of the curved-surface region A2 is determined according to the particular type of the display device.

In an alternative embodiment, the curved-surface region A2 is located on one side where any one of the first side edges or any one of the second side edges is located, in which case the curved-surface region A2 is provided on merely one side of the flat-surface region B2. For example, regarding a display device in which the curved-surface region A2 is provided on merely one side of the flat-surface region B2, when the display device is a rollable display device, the display device further includes a scroll, and the scroll is connected to the display panel 21, to realize the curling and deployment of the display panel 21 by using the scroll. Therefore, the edge position of the side of the display panel 21 that is fixed to the scroll may not be configured to be of a curved-surface structure, and when the side of the display panel 21 that is fixed to the scroll is the edge position of the second side of the display panel 21, the curved-surface region A2 is located at the edge position of the first side of the display panel 21, and the first side and the second side are opposite.

Figure 9:
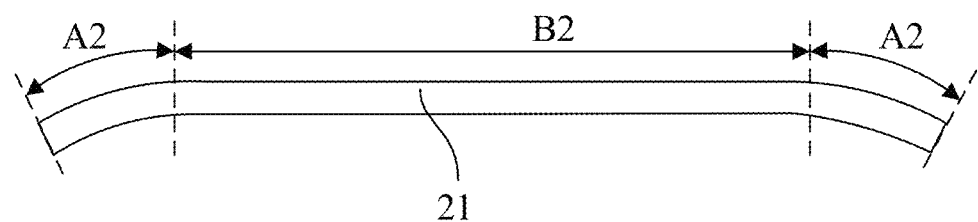
FIG. 9 shows a schematic sectional view of a display panel according to an embodiment of the present application.

In another alternative embodiment, as shown in FIG. 9, the curved-surface region A2 is located on the sides where the two first side edges or the two second side edges are located. In other words, the curved-surface region A2 is provided on two opposite sides of the flat-surface region B2, in which case the quantity of the curved-surface region A2 is 2. For example, regarding a display device in which the curved-surface region A2 is provided on two opposite sides of the flat-surface region B2, the display device may be a foldable display device, the foldable display device is folded or expanded along a folding shaft. When the folding shaft is parallel to the two first side edges, the curved-surface regions A2 are located on the sides where the two first side edges are located, in which case the sides where the two second side edges are located are not provided with the curved-surface region A2. When the folding shaft is parallel to the two second side edges, the curved-surface regions A2 are located on the sides where the two second side edges are located, in which case the sides where the two first side edges are located are not provided with the curved-surface region A2.

In yet another alternative embodiment, the curved-surface region A2 is located on the sides where the two first side edges and the two second side edges are located. In other words, the curved-surface region A2 is provided on all of the sides where the four side edges of the flat-surface region B2 are located, in which case the quantity of the curved-surface region A2 is 4. For example, regarding a display device in which the curved-surface region A2 is provided at all of the four side edges of the flat-surface region B2, the display device may be a watch.

Figure 14:
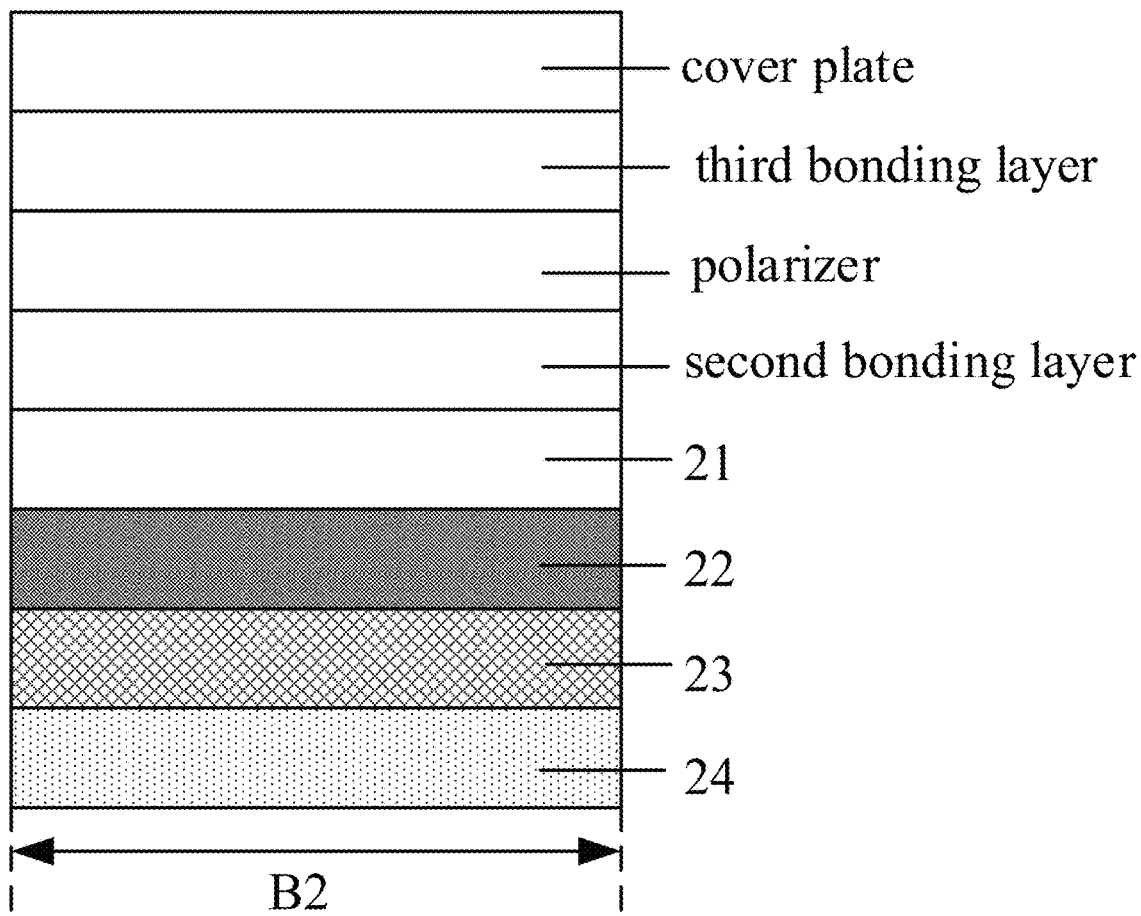
FIG. 14 shows a sectional view of a second bonding layer, a polarizer, a third bonding layer and a cover plate according to an embodiment of the present application.

In an embodiment of the present application, as shown in FIG. 14, the display device further includes: A second bonding layer, a polarizer, a third bonding layer and a cover plate that are sequentially arranged on the light-emitting surface of the display panel 21 in stack, and the second bonding layer, the polarizer, the third bonding layer and the cover plate are sequentially away from the display panel 21.

In other words, the second bonding layer is provided at the light-emitting surface of the display panel 21, the polarizer is provided on the side of the second bonding layer that is away from the display panel 21, the third bonding layer is provided on the side of the polarizer that is away from the second bonding layer, and the cover plate is provided on the side of the third bonding layer that is away from the polarizer.

The material of the second bonding layer is a pressure sensitive adhesive (PSA). The material of the third bonding layer is an optically clear adhesive (OCA). The material of the cover plate may be a material such as an ultrathin glass and a transparent PI. The polarizer may be a tensile-type polarizer or a coating-type polarizer.

Figure 10:
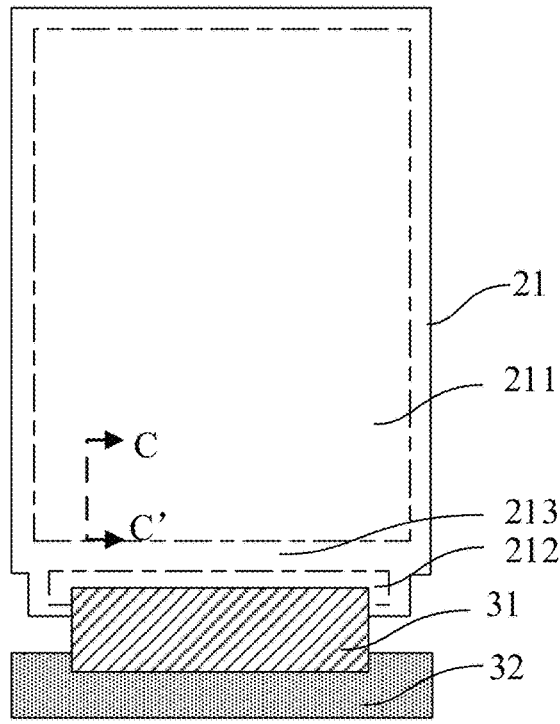
FIG. 10 shows a schematic plan view of a display device according to an embodiment of the present application.
Figure 15:
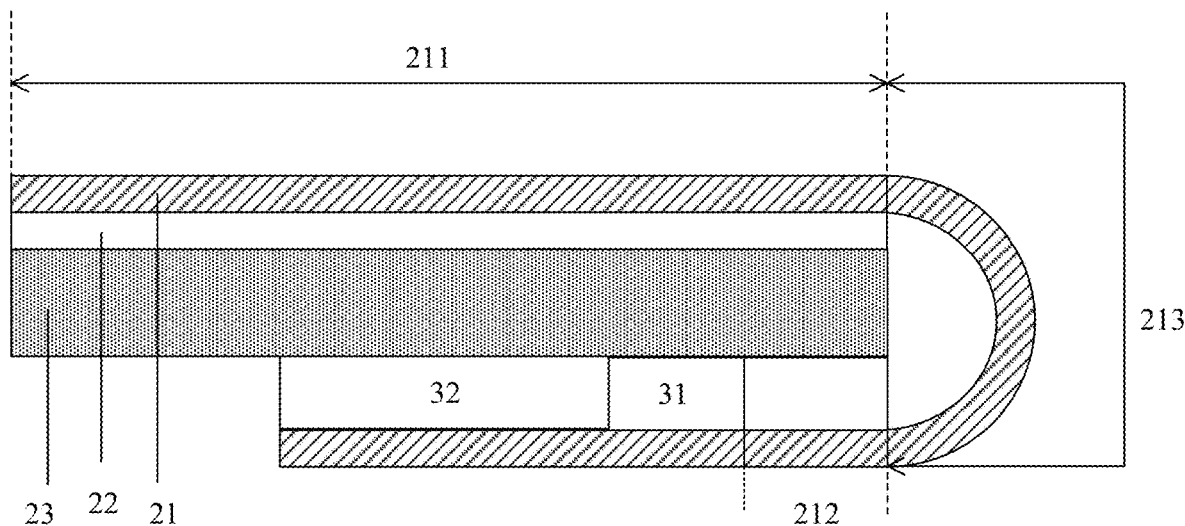
FIG. 15 shows a sectional view of a display device according to an embodiment of the present application when the display device has been bent.

As shown in FIG. 10 and FIG. 15, the display panel 21 includes the active area 211, a bonding region 212 and a bending region 213 located between the active area 211 and the bonding region 212. The display device further includes a bonding component 31 provided in the bonding region 212, and a flexible circuit board 32 bonded to the bonding component 31, the bonding component 31 and the flexible circuit board 32 are located on the opposite side of the light emitting side of the display panel 21, and the display panel 21 located in the bonding region 212 is bonded to the supporting layer 23.

In the practical product, the display panel 21, according to the functions of the regions, is delimited into the active area 211, the bonding region 212 and the bending region 213. The bending region 213 is located between the active area 211 and the bonding region 212. The active area 211 refers to the region for displaying the frames of the display panel 21. The bonding region 212 refers to the region for bonding the display panel 21 with the bonding component 31 and the flexible circuit board 32. Because after the display panel 21 and the flexible circuit board 32 are bonded through the bonding component 31, it is required to fix the bonding component 31 and the flexible circuit board 32 to the opposite side of the light emitting side of the display panel 21, it is required to bend the display panel 21, wherein the region that is bent is the bending region 213.

The display device further includes a bonding component 31 provided in the bonding region 212, and a flexible circuit board 32 bonded to the bonding component 31. The bonding component 31 is used to bond the display panel 21 and the flexible circuit board 32 together.

After the display panel 21 and the flexible circuit board 32 are bonded through the bonding component 31, by bending the bending region 213, the bonding component 31 and the flexible circuit board 32 are fixed on the opposite side of the light emitting side of the display panel 21. Furthermore, after the bending region 213 is bent, the display panel 21 located in the bonding region 212 is bonded to the supporting layer 23.

The bonding component 31 is a Chip On Film (COF) or a Chip On Pi (COP). If the bonding component 31 is a COF, the COF is adhered to the bonding region 212 of the display panel 21 by pressing, and subsequently the COF is bonded to the flexible circuit board 32. If the bonding component 31 is a COP, because the COP is directly formed in the bonding region 212 of the display panel 21, it is merely required to bond the COP with the flexible circuit board 32.

It should be noted that, regarding a rollable display device, the curved-surface region A2 is provided on merely one side of the flat-surface region B2, and the curved-surface region A2 is located on the side of the active area 211 that is close to the bonding region 212. Regarding a foldable display device, the curved-surface region A2 is provided on two opposite sides of the flat-surface region B2, and the bending region 213 and the bonding region 212 may be provided on the side where any one of the curved-surface regions A2 is located.

It should be noted that the sectional view obtained along the cross-section C-C' shown in FIG. 10 is the sectional views shown in FIG. 2 to FIG. 4.

In practical applications, the display device may be any product or component that is provided with the function of displaying, such as an electronic paper, a mobile phone, a tablet personal computer, a display, a notebook computer and a navigator, and the product or component further provided with the function of folding or curling.

In the embodiments of the present application, by providing the perforative second slot in the supporting layer located in the curved-surface region, and providing the first slot in the protecting layer in the corresponding region, wherein the first slot communicates with the second slot, when the first bonding layer is provided inside the first slot and the second slot, the bonding forces of the first bonding layer with the protecting layer and the supporting layer are increased, so that the display panel formed with the protecting layer may be stably and firmly adhered to the supporting layer having the curved-surface structure, which prevents separation between the protecting layer and the supporting layer, thereby ensuring the normal proceeding of the subsequent process step of complete-device assembling of the display device, and improving the reliability of the product.

Figure 11:
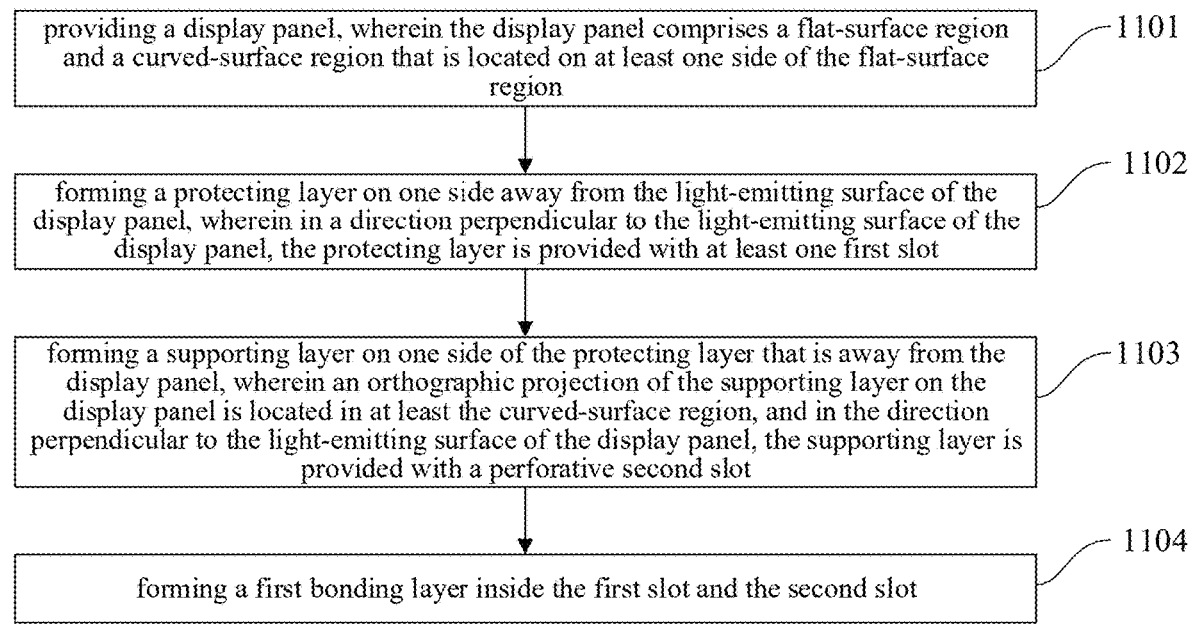
FIG. 11 shows a flow chart of a method for fabricating a display device according to an embodiment of the present application.

Referring to FIG. 11, which shows a flow chart of a method for fabricating a display device according to an embodiment of the present application. The method may particularly include the following steps:

Step 1101: providing a display panel, wherein the display panel includes a flat-surface region and a curved-surface region that is located on at least one side of the flat-surface region.

In an embodiment of the present application, firstly, a pixel driving circuit is formed on a flexible substrate. Subsequently, a light-emitting-device layer is formed on the side of the pixel driving circuit that is away from the flexible substrate. Subsequently, a packaging layer covering the light-emitting-device layer is formed. Finally, a touch-controlling-function layer is formed on the side of the packaging layer that is away from the light-emitting-device layer, to obtain the display panel 21.

The display panel 21 includes a flat-surface region B2 and a curved-surface region A2 that is located on at least one side of the flat-surface region B2. Particularly, the curved-surface region A2 may be provided on one side of the flat-surface region B2, the curved-surface region A2 may also be provided on two opposite sides of the flat-surface region B2, and the curved-surface region A2 may also be provided at all of the four side edges of the flat-surface region B2.

Step 1102: forming a protecting layer on one side away from the light-emitting surface of the display panel, wherein in a direction perpendicular to the light-emitting surface of the display panel, the protecting layer is provided with at least one first slot.

Figure 12:
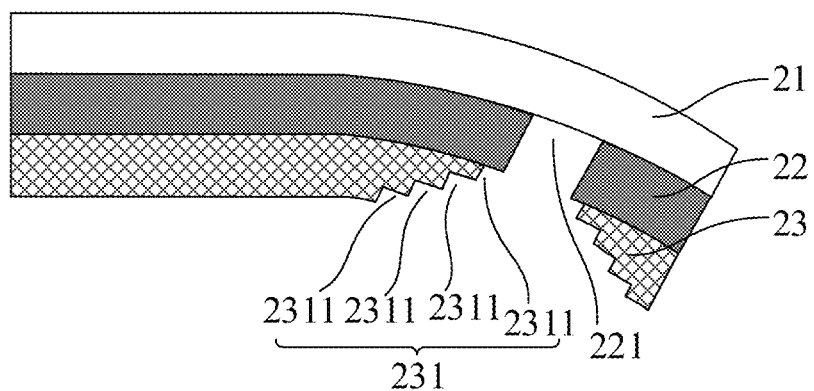
FIG. 12 shows a first sectional view obtained after the formation of the protecting layer and the supporting layer on the backlight side of the display panel according to an embodiment of the present application.
Figure 13:
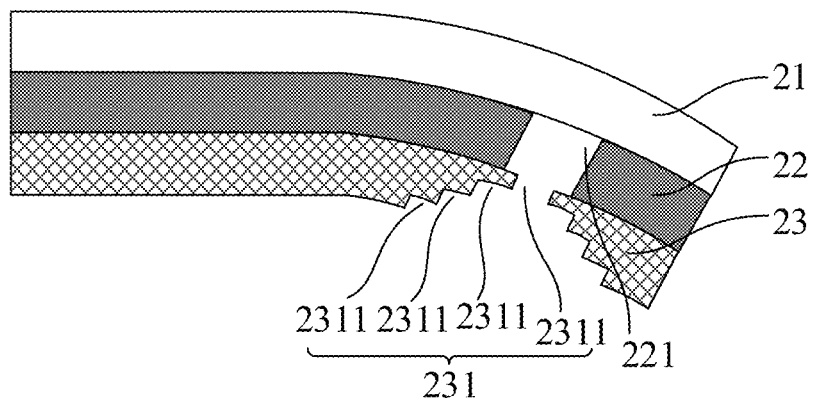
FIG. 13 shows a second sectional view obtained after the formation of the protecting layer and the supporting layer on the backlight side of the display panel according to an embodiment of the present application.

In an embodiment of the present application, as shown in FIG. 12 and FIG. 13, after the display panel 21 is manufactured, a protecting layer 22 is formed on the side of the display panel 21 that is opposite to the light-emitting surface, and the orthographic projection of the protecting layer 22 on the display panel 21 is located in the flat-surface region B2 and the curved-surface region A2 of the display panel 21. Furthermore, in the direction perpendicular to the light-emitting surface of the display panel 21, the protecting layer 22 is provided with at least one first slot 221, and each of the first slots 221 may extend throughout the protecting layer 22, and may not extend throughout the protecting layer 22.

Step 1103: forming a supporting layer on one side of the protecting layer that is away from the display panel, wherein an orthographic projection of the supporting layer on the display panel is located in at least the curved-surface region, and in the direction perpendicular to the light-emitting surface of the display panel, the supporting layer is provided with an perforative second slot.

In an embodiment of the present application, as shown in FIG. 12 and FIG. 13, after the protecting layer 22 is formed on the side of the display panel 21 that is opposite to the light-emitting surface, a supporting layer 23 may be formed on the side of the protecting layer 22 that is away from the display panel 21, and the orthographic projection of the supporting layer 23 on the display panel 21 is located at least in the curved-surface region A2 of the display panel 21.

The edge of the supporting layer 23 is processed to be of a curved-surface structure in advance by using a stamping process, so that the supporting layer 23 includes a flat-face structure and a curved-surface structure. Furthermore, in the direction perpendicular to the light-emitting surface of the display panel 21, the supporting layer 23 is provided with a perforative second slot 231. An overlap area exists between the orthographic projection of the first slot 221 on the display panel 21 and the orthographic projection of the second slot 231 on the display panel 21, and the orthographic projection of the second slot 231 on the display panel 21 is located in the curved-surface region A2. The quantity of the second slot 231 may be one or more.

Particularly, in the direction perpendicular to the light-emitting surface of the display panel 21, the second slot 231 includes at least two sub-slots 2311 that are sequentially communicated, and, regarding any two adjacent sub-slots 2311, the orthographic projection on the display panel 21 of the sub-slot 2311 close to the display panel 21 is located in the orthographic projection on the display panel 21 of the sub-slot 2311 away from the display panel 21.

As shown in FIG. 12, the orthographic projection on the display panel 21 of the sub-slot 2311 closest to the display panel 21 covers the orthographic projection of the first slot 221 on the display panel 21. As shown in FIG. 13, the orthographic projection on the display panel 21 of the sub-slot 2311 closest to the display panel 21 is located in the orthographic projection of the first slot 221 on the display panel 21, and all of the orthographic projections on the display panel 21 of the other sub-slots 2311 of the second slot 231 than the sub-slot 2311 closest to the display panel 21 cover the orthographic projection of the first slot 221 on the display panel 21.

It should be noted that, after the protecting layer 22 is formed on the side of the display panel 21 that is opposite to the light-emitting surface, the process may include, firstly, in the bonding region 212 of the display panel 21, bonding the display panel 21 and the flexible circuit board 32 together by using the bonding component 31; subsequently, forming sequentially a second bonding layer, a polarizer, a third bonding layer and a cover plate on the light-emitting surface of the display panel 21; and, subsequently, forming the supporting layer 23 on the side of the protecting layer 22 that is away from the display panel 21.

Step 1104: forming a first bonding layer inside the first slot and the second slot.

In an embodiment of the present application, after the supporting layer 23 is formed on the side of the protecting layer 22 that is away from the display panel 21, a first bonding layer 24 is formed inside the first slot 221 and the second slot 231, to obtain the structure shown in FIG. 2 to FIG. 4. Particularly, the first bonding layer 24 may be formed inside the first slot 221 and the second slot 231 by using processes such as spray coating and glue dispensing.

Moreover, it is further required to solidify the first bonding layer 24, to enhance the effect of the bonding between the display panel 21 provided with the protecting layer 22 and the supporting layer 23. The material of the first bonding layer 24 may be an ultraviolet solidification-type adhesive or a thermal solidification-type adhesive. When the material of the first bonding layer 24 is an ultraviolet solidification-type adhesive, Ultraviolet Rays (UV) may be used to irradiate the first bonding layer 24 to realize the solidification. When the material of the first bonding layer 24 is a thermal solidification-type adhesive, heating treatment may be used to solidify the first bonding layer 24.

It should be noted that, after the first bonding layer 24 is formed inside the first slot 221 and the second slot 231, it is required to bend the bending region 213, so that the bonding component 31 and the flexible circuit board 32 are fixed on the side of the display panel 21 that is away from the light-emitting surface.

In the embodiments of the present application, by providing the perforative second slot in the supporting layer located in the curved-surface region, and providing the first slot in the protecting layer in the corresponding region, wherein the first slot and the second slot are in communication with each other, when the first bonding layer is provided inside the first slot and the second slot, the bonding forces of the first bonding layer with the protecting layer and the supporting layer are increased, so that the display panel formed with the protecting layer can be stably and firmly adhered to the supporting layer having the curved-surface structure, which prevents separation between the protecting layer and the supporting layer, thereby ensuring the normal proceeding of the subsequent process step of complete-device assembling of the display device, and improving the reliability of the product.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "include" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A display device, wherein the display device comprises:
a display panel;
a protecting layer provided on one side away from a light-emitting surface of the display panel; and
a supporting layer provided on one side of the protecting layer that is away from the display panel;
wherein, the display panel comprises a flat-surface region, and a curved-surface region that is located on at least one side of the flat-surface region, and an orthographic projection of the supporting layer on the display panel is located at least in the curved-surface region;
in a direction perpendicular to the light-emitting surface of the display panel, the protecting layer is provided with at least one first slot, the supporting layer is provided with a perforative second slot, an overlap region exists between an orthographic projection of the first slot on the display panel and an orthographic projection of the second slot on the display panel, and the orthographic projection of the second slot on the display panel is located in the curved-surface region; and
the display device further comprises a first bonding layer that is provided inside the first slot and the second slot;
wherein the display device further comprises: a second bonding layer, a polarizer, a third bonding layer and a cover plate that are sequentially arranged on the light-emitting surface of the display panel in stack, and the second bonding layer, the polarizer, the third bonding layer and the cover plate are sequentially away from the display panel.

2. The display device according to claim 1, wherein the supporting layer is provided with second slots corresponding to the first slots one by one, and each of the first slots communicates with the corresponding second slot.

3. The display device according to claim 2, wherein in the direction perpendicular to the light-emitting surface of the display panel, each of the second slots comprises at least two sub-slots that are sequentially communicated, and for any two adjacent sub-slots, an orthographic projection on the display panel of a sub-slot close to the display panel is located in an orthographic projection on the display panel of a sub-slot away from the display panel.

4. The display device according to claim 3, wherein an orthographic projection on the display panel of a sub-slot closest to the display panel covers an orthographic projection of the first slot on the display panel.

5. The display device according to claim 3, wherein an orthographic projection on the display panel of a sub-slot closest to the display panel is located in an orthographic projection of the first slot on the display panel, and all of orthographic projections on the display panel of the sub-slots of the second slot other than the sub-slot closest to the display panel cover the orthographic projection of the first slot on the display panel.

6. The display device according to claim 1, wherein the protecting layer is provided with at least two first slots, the supporting layer is provided with one or more second slots, and an orthographic projection of each of the second slots on the display panel covers orthographic projections of at least two first slots on the display panel.

7. The display device according to claim 1, wherein the orthographic projection of the supporting layer on the display panel is further located in the flat-surface region.

8. The display device according to claim 1, wherein a depth of the first slot is less than or equal to a thickness of the protecting layer, and the thickness of the protecting layer is 25 μm to 200 μm.

9. The display device according to claim 1, wherein the protecting layer is provided with a plurality of the first slots, and a plurality of the first slots are distributed in a row direction and/or a column direction.

10. The display device according to claim 1, wherein a shape of the orthographic projection of the first slot on the display panel is a rectangle, a length of the first slot in the row direction is 5 mm to 30 mm, and a width of the first slot in the column direction is 1 mm to 3 mm; or a shape of the orthographic projection of the first slot on the display panel is a circle, and a diameter of the first slot is 1 mm to 3 mm.

11. A display device, wherein the display device comprises:
a display panel;
a protecting layer provided on one side away from a light-emitting surface of the display panel; and
a supporting layer provided on one side of the protecting layer that is away from the display panel;
wherein, the display panel comprises a flat-surface region, and a curved-surface region that is located on at least one side of the flat-surface region, and an orthographic projection of the supporting layer on the display panel is located at least in the curved-surface region;
in a direction perpendicular to the light-emitting surface of the display panel, the protecting layer is provided with at least one first slot, the supporting layer is provided with a perforative second slot, an overlap region exists between an orthographic projection of the first slot on the display panel and an orthographic projection of the second slot on the display panel, and the orthographic projection of the second slot on the display panel is located in the curved-surface region; and
the display device further comprises a first bonding layer that is provided inside the first slot and the second slot;
wherein the display panel comprises an active area, and the active area at least comprises the flat-surface region;
wherein the display panel comprises the active area, a bonding region and a bending region located between the active area and the bonding region;
the display device further comprises a bonding component provided in the bonding region, and a flexible circuit board bonded to the bonding component; and
the bonding component and the flexible circuit board are located on an opposite side of a light emitting side of the display panel, and the display panel located in the bonding region is bonded to the supporting layer.

12. The display device according to claim 11, wherein the active area completely overlaps with the flat-surface region; or the active area comprises the flat-surface region and part of the curved-surface region; or the active area comprises the flat-surface region and the entire curved-surface region.

\* \* \* \* \*